United States Patent [19]
Kolanko et al.

[11] Patent Number: 5,770,979
[45] Date of Patent: Jun. 23, 1998

[54] PROGRAMMABLE OSCILLATOR USING ONE CAPACITOR

[75] Inventors: Frank J. Kolanko, Greenville, R.I.; Donald R. Laybourn, Novi, Mich.

[73] Assignee: Cherry Semiconductor Corporation, East Greenwich, R.I.

[21] Appl. No.: 748,337

[22] Filed: Nov. 13, 1996

Related U.S. Application Data

[60] Provisional application No. 60/018,063, May 21, 1996.
[51] Int. Cl.$^6$ ............................................. H03B 5/24
[52] U.S. Cl. ............................ 331/111; 331/143; 331/179
[58] Field of Search .................................... 331/111, 143, 331/179

[56] References Cited

U.S. PATENT DOCUMENTS 3,824,484  7/1974  Gillette ............................. 331/179 X

*Primary Examiner*—David Mis
*Attorney, Agent, or Firm*—Bromberg & Sunstein LLP

[57] ABSTRACT

A programmable oscillator comprising a switching circuit, a first driver circuit, and a second driver circuit, the oscillator being programmable to switch at a first switching frequency or a second switching frequency by utilizing only one external capacitor and two external resistors. Only one driver circuit is active at a time to charge and discharge the capacitor at one of the switching frequencies. The driver circuits are made active or inactive by a control circuit.

19 Claims, 2 Drawing Sheets

PROGRAMMABLE OSCILLATOR USING ONE CAPACITOR

This application claims the benefit of U.S. Provisional Application No. 60/018,063, filed 21 May 1996, the entire disclosure of which is hereby incorporated by reference herein.

FIELD OF THE INVENTION

The present invention relates to programmable oscillators, and in particular to a programmable oscillator which uses only one external capacitor.

BACKGROUND OF THE INVENTION

Some families of programmable oscillators, or switching circuits, manufactured as integrated circuits require an external capacitor and resistor to oscillate, where the oscillation or switching frequency is a function of the time constant RC, where R is the resistance of the external resistor and C is the capacitance of the external capacitor.

For some applications, it is desirable to provide an oscillator with the capability of oscillating or switching at two or more distinct frequencies. For example, it may be necessary to respond to various events in which the response time varies according to the different events. A response time can be realized by using an oscillator and a counter circuit driven by the oscillator, in which case the response time depends upon the oscillation frequency. Consequently, different response times can be realized with the same counter circuit provided different oscillation or switching frequencies are provided to the counter circuit. Hence the need for synthesizing more than one frequency. Alternatively, a plurality of oscillation frequencies can be synthesized by utilizing more than one single-frequency oscillator in which each single-frequency oscillator requires an external capacitor.

SUMMARY OF THE INVENTION

It is an object of the present invention to provide a programmable switching oscillator in which the frequency of the oscillator can be changed in a flexible way utilizing only one external capacitor.

An embodiment of the present invention comprises a bistable switching circuit and first and second driver circuits coupled to the switching circuit. Each driver circuit may be enabled or made inactive separately from the other. When enabled, a driver circuit is responsive to the state of the switching circuit and charges and discharges an external capacitor via an external resistor, where the switching frequency is a function the capacitance of the external capacitor and the resistance of the external resistor. When made inactive, a driver circuit presents a high impedance at its output and does not charge or discharge the external capacitor.

In another embodiment of the present invention, each driver circuit comprises a first transistor, a second transistor, a third transistor, and two inputs. A driver circuit is made inactive by holding both of its inputs at the ground potential, which keeps the first transistor OFF and the second transistor is prevented from conducting current by action of the third transistor. When a driver circuit is active, the first transistor acts as an active pulldown for discharging the external capacitor when the switching circuit is in one of its two states, and the second transistor acts as a active pullup for charging the external capacitor when the switching circuit is in its other state.

Other objects and advantages of the invention will become apparent during the following description of the presently preferred embodiments of the invention taken in conjunction with the drawings.

DETAILED DESCRIPTION OF THE EMBODIMENTS

Figure 1:
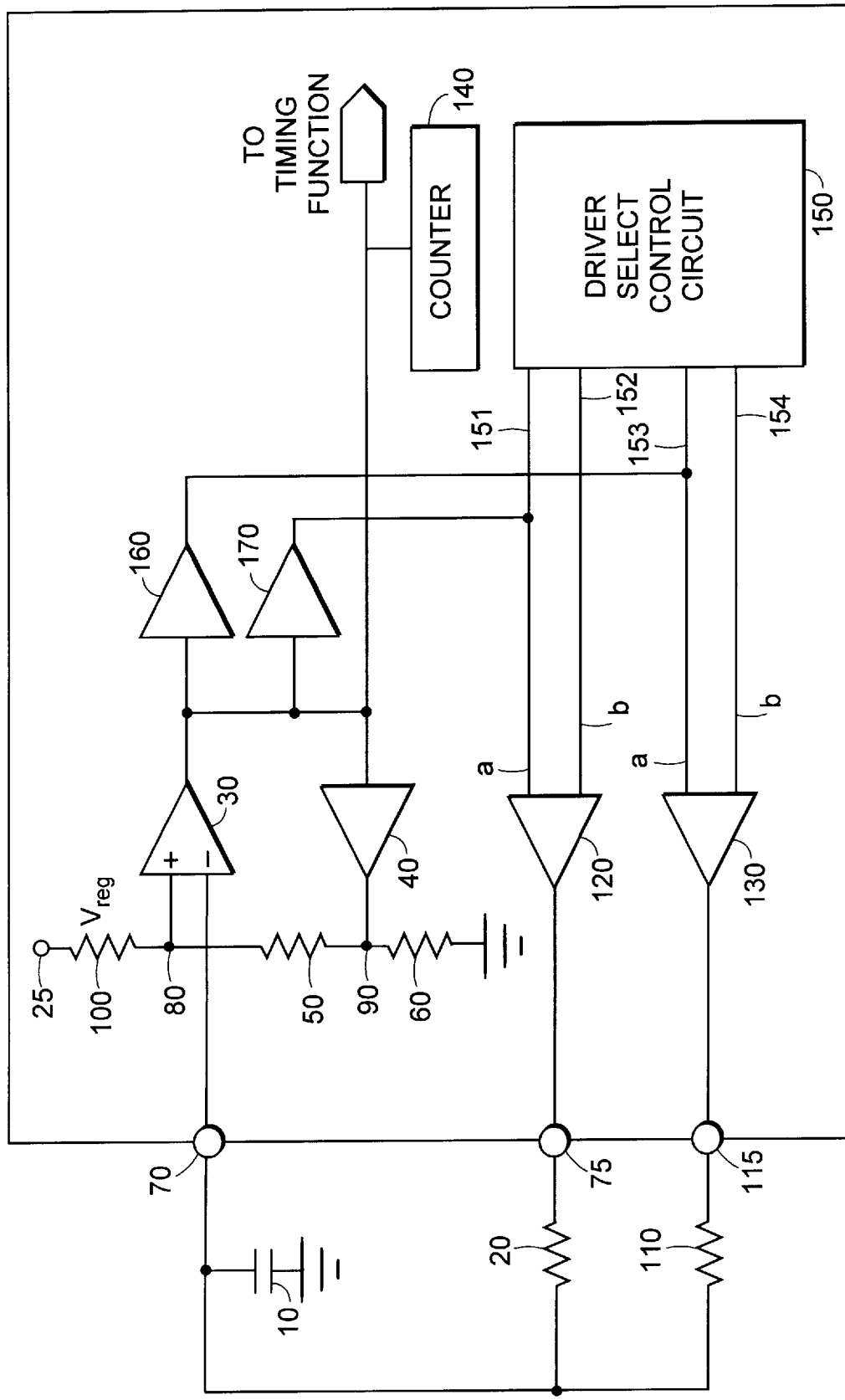
FIG. 1 is a block diagram of an embodiment of the present invention.

FIG. 1 illustrates a circuit for a programmable oscillator with a first and second switching frequency, where the first and second frequencies are functions, respectively, of the products $R_1C$ and $R_2C$, where C is the capacitance of capacitor 10, $R_1$ is the resistance of resistor 20, and $R_2$ is the resistance of resistor 110. The components illustrated within solid line 180 are fabricated on a single integrated circuit die, whereas capacitor 10, and resistors 20 and 110 are external to the die. A regulated voltage is applied to power supply terminal 25.

Difference amplifier 30, switching element 40, and resistors 50, 60, and 100 comprise a bistable switching circuit. Switching element 40 is OFF (e.g., it provides at its output a very high impedance or effectively an open-circuit) when its input is HIGH and is ON (e.g., it provides at its output a very low impedance path to ground) when its input is LOW. Switching element 40 and the voltage divider formed by resistors 50 and 60 comprise a feedback circuit coupling the output of difference amplifier 30 to one of its inputs, to thereby provide a hysteresis function.

Switching of the circuit in FIG. 1 is easily explained as follows. For a fixed reference voltage applied to terminal 25, the voltage at node 80 depends upon the state of switching element 40. The voltage at node 80 when switching element 40 is ON, which we will refer to as the LOW threshold, is less than the voltage at node 80 when switching element 40 is OFF, which we will refer to as the HIGH threshold. The HIGH and LOW thresholds depend upon the reference voltage applied to terminal 25 and the resistance values of resistors 100, 50, and 60. The feedback provided by switching element 40 provides a hysteresis function to the circuit of FIG. 1 in which the voltage at node 80 is at one of two distinct thresholds, the HIGH threshold and the LOW threshold. The arrangement of difference amplifier 30, switching element 40, and resistors 50, 60, and 100 functions as a bistable switching circuit, with a HIGH (LOW) state in which the voltage at node 80 is at the HIGH (LOW) threshold. The arrangement of difference amplifier 30 and switching element 40 may alternatively be considered a comparator with hysteresis.

Bistable switching circuits may be constructed differently than the present embodiment disclosed herein, and can encompass any circuit with two or more stable states in which the circuit switches from a first state to a second state when an input voltage to the circuit is greater than a first threshold and switches from the second state to the first state when the input voltage to the circuit is less than a second threshold.

Buffer amplifiers or stages 160 and 170 couple difference amplifier 30 to driver circuits 120 and 130. During operation of the circuit of FIG. 1, driver circuits 120 and 130 either provide for charging and discharging of external capacitor 10 (which we will refer to as the active state) or present at their outputs a very high impedance path to the ground (which we refer to as the inactive state) so that no charging and discharging takes place. The high impedance path to ground has a resistance much larger than the resistances of resistors 20 or 110, and is effectively an open circuit. During their active states, driver circuits 120 and 130 have a low output impedance, i.e., their output impedance is much less in magnitude than the resistances of 20 or 110 or the capacitance of capacitor 10. Driver 120 (130) is active if its "a" input is responsive to the output of buffer 170 (160), and if a high input impedance (open circuit) is provided at its "b" input. Driver 120 (130) is inactive if both of its inputs are held at the ground potential. Only one driver is allowed to be active at a time. When active, driver 120 (130) charges capacitor 10 when its "a" input is HIGH and discharges capacitor 10 when its "b" input is LOW.

Assume that driver 120 is active and driver 130 is inactive. Also, assume that the circuit of FIG. 1 is in a first state in which the output of difference amplifier 30 is HIGH, the voltage at node 80 is at the HIGH threshold, and capacitor 10 is being charged with a time constant determined by the capacitance of capacitor 10, the resistance of resistor 20, and the output impedance of driver 120. In practice, the output impedance of driver 120 (as well as driver 130) may be ignored when considering the time constant of the circuit in FIG. 1. As capacitor 10 is charging, the capacitor voltage at terminal 70 is increasing. When the capacitor voltage at terminal 70 exceeds the HIGH threshold, the output of difference amplifier 30 goes LOW, turning ON switching element 40, which shunts node 90 to ground and brings the voltage at node 80 from the HIGH threshold to the LOW threshold. We refer to this new circuit state as the second state. In the second state, capacitor 10 begins to discharge via resistor 20. As capacitor 10 is discharging, the capacitor voltage at terminal 70 is decreasing. When the capacitor voltage at terminal 70 falls below the LOW threshold, the output of difference amplifier 30 will go HIGH, switching OFF element 40, which brings the voltage at node 80 from the LOW threshold to the HIGH threshold, and the circuit of FIG. 1 switches from the second state to the first state and capacitor 10 begins again to charge. Thus, the circuit of FIG. 1 switches between the first and second states at a frequency determined by the capacitance of capacitor 10, the resistances of resistors 20, 50, 60, and 100, and the regulated voltage applied to power supply voltage terminal 25.

Similarly, the circuit of FIG. 1 will switch at a different frequency if driver 120 is made inactive and driver 130 is made active because capacitor 10 would then be charging and discharging via resistor 110, which we assume has a different resistance than that of resistor 20. Therefore, the circuit of FIG. 1 is a dual programmable oscillator in which its two switching frequencies are distinct provided resistors 20 and 110 have different resistances.

Driver select control circuit 150 is connected to driver circuits 120 and 130 via lines 151, 152, 153, and 154. When lines 153 and 154 are held at zero volts, driver circuit 130 is in its inactive state. Similarly, when lines 151 and 152 are held at zero volts, driver circuit 120 is in its inactive state. Driver circuit 120 is in its active state and is responsive to difference amplifier 30 when the impedances at lines 151 and 152 looking into driver select control circuit 150 are high. Similarly, driver circuit 130 is in its active state and is responsive to difference amplifier 30 when the impedances at lines 153 and 154 looking into driver circuit 130 are high.

Consequently, when driver select control circuit 150 presents a high impedance path to the ground at lines 151 and 152, and when select control circuit 150 holds lines 153 and 154 at the ground potential, driver circuit 120 is in its active state and charges and discharges capacitor 10 via resistor 20 at a first switching frequency. Similarly, when driver select control circuit 150 presents a high impedance path to the ground at lines 153 and 154 and holds 151 and 152 at the ground potential, driver circuit 130 is in its active state and charges and discharges capacitor 10 via resistor 110 at a second switching frequency.

In the embodiment illustrated in FIG. 1, driver select control circuit 150 is under the control of counter 140. Counter 140 switches driver select control circuit 150 so that for a first predetermined number of counts, driver circuit 120 is active and driver circuit 130 is inactive, and for a second predetermined number of counts, driver circuit 120 is inactive and driver circuit 130 is active. In other embodiments, driver select control circuit 150 may be controlled by other means.

Figure 2:
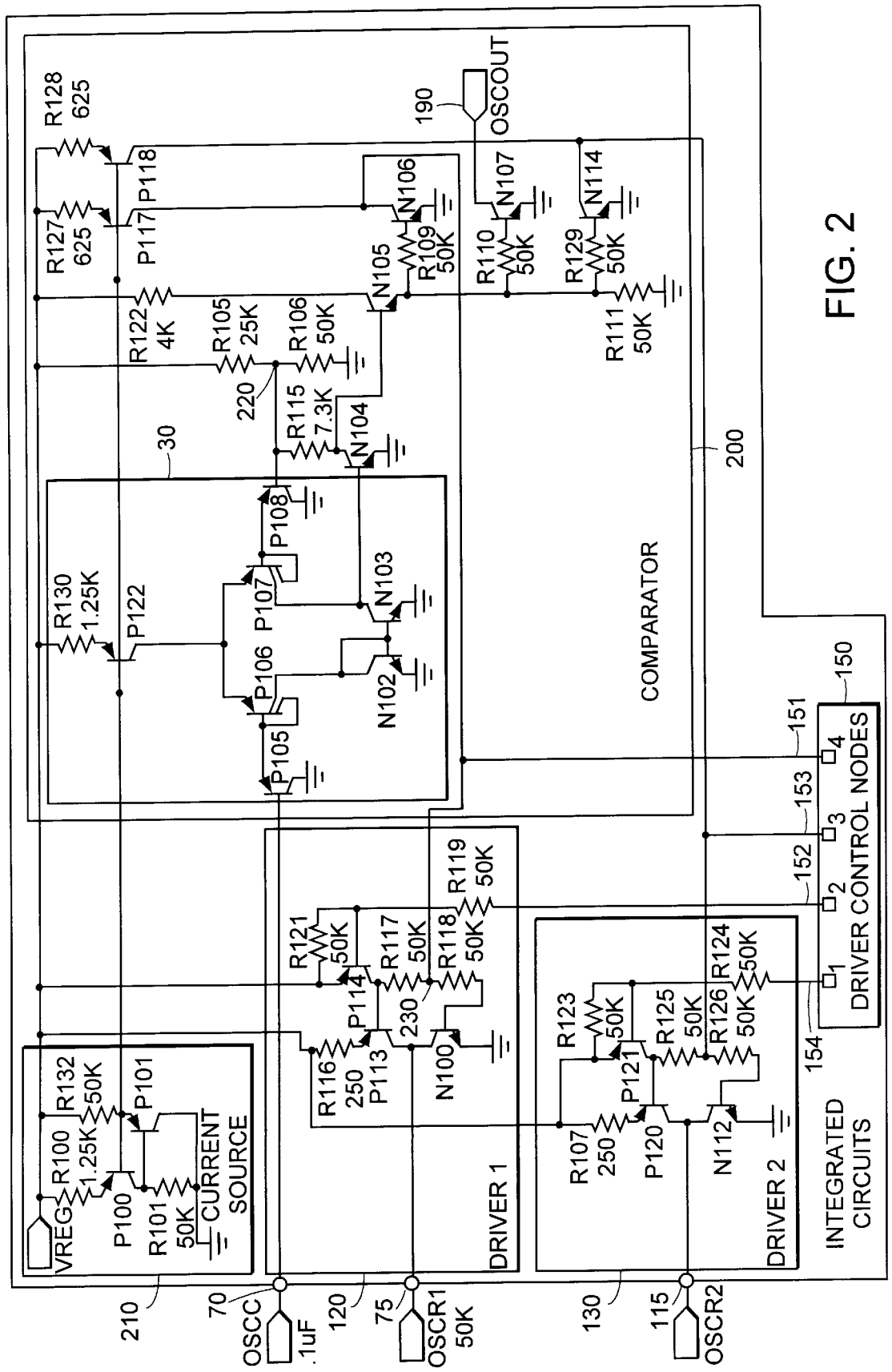
FIG. 2 is a circuit schematic of an embodiment of the present invention.

FIG. 2 is a schematic of another embodiment of the present invention. Transistors P105, P106, P107, P108 form part of difference amplifier 30, where transistor P122 provides the long-tailed current and transistors N102 and N103 comprise a current mirror configured as an active load. The output of difference amplifier 30 may be considered to be the collector of transistor N103, which is connected to the base of transistor N104. The collector of transistor N104 is connected to the base of transistor P108 via resistor R115. This connection provides feedback between the output of difference amplifier 30 and one of its inputs, which is the base of transistor P108, to thereby provide a hysteresis function.

The collector of transistor N104 is connected to the base of transistor N105, which serves as an emitter follower stage, in which the emitter of transistor N105 drives the base of transistors N106, N107 and N114. Transistor N114, along with its active load transistor P118, serves as buffer amplifier 160 of FIG. 1. Similarly, transistor N106, along with its active load transistor P117, serves as buffer amplifier 170 of FIG. 1. Transistor N107 serves as an open collector transistor switch in which its collector is connected to output terminal 190. The circuitry within solid line 200 may be considered a comparator circuit with hysteresis, and output terminal 190 may be considered as the open collector output of the comparator circuit. Output terminal 190 is connected to additional circuitry, not shown, which is switched ON and OFF at either the first or second switching frequency.

The circuit 210 serves as a current source reference and biases transistors P122, P117, and P118. Not shown in FIG. 2 is capacitor 10 and resistors 20 and 110 of FIG. 1, which are connected to terminals 70, 75, and 115 as shown in FIG. 1.

To consider the operation of the circuit of FIG. 2 at the first switching frequency, suppose that driver select control circuit 150 provides a high impedance on lines 151 and 152 and the ground potential on lines 153 and 154. Suppose difference amplifier 30 is initially in a first state in which the voltage at the collector of transistor N103 is LOW so that transistor N104 is OFF. With transistor N104 OFF, the base voltage of transistor N105 is equal to the voltage at node 220, i.e., the first threshold. The first threshold is determined by the voltage divider comprising resistors R105 and R106 and the reference voltage applied to the VREG terminal, the first threshold is set at a value to be sufficiently high so that transistors N105 and N106 are conducting. With transistor N106 ON, the voltage at node 230 in driver circuit 120 is close to the ground potential, so that transistor N100 is OFF and transistor P113 is conducting. Because driver select control circuit 150 provides a high impedance to line 152, transistor P114 is not conducting and does not affect operation of transistor P113. With transistor P113 conducting, transistor P113 acts as an active pullup and driver circuit 120 charges capacitor 10 via resistor 20, and thus the capacitor voltage at terminal 70 will increase.

When the capacitor voltage reaches the first threshold (currently the voltage at node 220), difference amplifier 30 will go into a second state in which the voltage at the collector of transistor N103 will go HIGH, turning transistor N104 ON and effectively placing resistor R115 in parallel with resistor R106. This lowers the voltage at node 220 to the second threshold, which is now determined by the reference voltage applied to the VREG terminal and the voltage divider comprising resistor R105 in series with the parallel combination of resistors R106 and R115. With transistor N104 ON, the collector voltage of transistor N106, and consequently the voltage at node 230, will go HIGH, which causes transistor N100 to conduct and turns transistor P113 OFF, and transistor N100 acts as an active pulldown, discharging capacitor 10 via resistor 20. The capacitor voltage at terminal 70 will then decrease. When the capacitor voltage decreases below the second threshold, the cycle just described repeats itself, with driver circuit 120 charging and discharging capacitor 10 at the first switching frequency. Driver circuit 130 does not affect the first switching frequency because lines 154 and 153 are held at the ground potential, so that transistor N112 is OFF and transistor P121 conducts so as to keep transistor P120 OFF. Consequently, with both transistors N112 and P120 OFF, driver circuit 130 presents a high impedance to terminal 115 and substantially zero current flows through resistor 110.

Therefore, we see that when driver select control circuit 150 presents a high impedance to lines 151 and 152 and the ground potential to lines 153 and 154, driver circuit 130 is in its inactive state, and driver circuit 120 is in its active state, charging and discharging capacitor 10 at the first switching frequency. Thus, the oscillator circuit of FIG. 2 is programmed to switch at the first switching frequency.

Similarly, the oscillator circuit of FIG. 2 will be programmed to oscillate at the second switching frequency when driver select control circuit 150 presents a high impedance to lines 153 and 154 and the ground potential to lines 151 and 152.

Driver circuits for charging and discharging capacitor 10 may be constructed differently from the particular embodiment disclosed in FIG. 2, and can comprise any circuit for charging and discharging a capacitor in which, when looking into the output of the circuit for charging and discharging, the circuit behaves as either a low impedance non-zero voltage source, a low impedance path to ground (i.e., a low impedance zero voltage source), or a very high impedance (open-circuit). Various other modifications to the embodiments described herein can be made without departing from the scope and spirit of the present invention. For example, the embodiments disclosed here are dual programmable oscillators, but it should be clear to one of ordinary skill in the art that the embodiments of FIGS. 1 and 2 can be modified to programmable oscillators with more than two switching frequencies.

What is claimed is:

1. A programmable oscillator with first and second switching frequencies, the programmable oscillator comprising:

a first resistor terminal for coupling to a first resistor;

a second resistor terminal for coupling to a second resistor;

a capacitor terminal for coupling to a capacitor;

a switching circuit, coupled to the capacitor terminal to be responsive to a capacitor voltage at the capacitor terminal, the switching circuit having first and second stable states;

a first driver circuit, having a first input coupled to the switching circuit and having a second input, to provide at the first resistor terminal: a first drive voltage only when the switching circuit is in the first state and when a high control impedance path is provided between the second input of the first driver circuit and a ground; a first low impedance path to the ground only when the switching circuit is in the second state and when the high control impedance path is provided between the second input of the first driver circuit and the ground; and a first high impedance path to the ground when the first and second inputs of the first driver circuit are at a low voltage with respect to the ground; and a second driver circuit, having a first input coupled to the switching circuit and having a second input, to provide at the second resistor terminal: a second drive voltage only when the switching circuit is in the first state and when the high control impedance path is provided between the second input of the second driver circuit and the ground; a second low impedance path to the ground only when the switching circuit is in the second state and when the high control impedance path is provided between the second input of the second driver circuit and the ground; and a second high impedance path to the ground when the first and second inputs of the second driver circuit are at a low voltage with respect to the ground.

2. The programmable oscillator as set forth in claim 1, wherein when the first resistor couples the first resistor terminal to the capacitor terminal, the second resistor couples the second resistor terminal to the capacitor terminal, and the capacitor couples the capacitor terminal to the ground, the programmable oscillator is programmed to oscillate at the first switching frequency when the first and second inputs of the second driver circuit are at the low voltage with respect to the ground, the high control impedance path to the ground is provided at the second input of the first driver circuit, and the first input of the first driver circuit is responsive to the first and second states of the switching circuit so as to provide sequentially at the first resistor terminal the first drive voltage and the first low impedance path to the ground at the first switching frequency; and the programmable oscillator is programmed to oscillate at the second switching frequency when the first and second inputs of the first driver circuit are at the low voltage with respect to the ground, the high control impedance path to the ground is provided at the second input of the second driver circuit, and the first input of the second driver circuit is responsive to the first and second states of the switching circuit so as to provide sequentially at the second resistor terminal the second drive voltage and the second low impedance path to the ground at the second switching frequency.

3. The programmable oscillator as set forth in claim 2, further comprising a control circuit coupled to the first and second driver circuits to provide the high control impedance path to the ground and the low voltage with respect to the ground.

4. The programmable oscillator as set forth in claim 3, wherein the switching circuit comprises:

a difference amplifier with an output, a first input, and a second input coupled to the capacitor terminal; and a feedback circuit coupling the output of the difference amplifier to the first input of the difference amplifier to provide a hysteresis function to the switching circuit.

5. The programmable oscillator as set forth in claim 1, wherein the first driver circuit comprises:
   a first transistor to provide at the first resistor terminal the first low impedance path to the ground when the first transistor is conducting;
   a second transistor to provide at the first resistor terminal the first drive voltage when the second transistor is conducting; and
   a third transistor to prevent the second transistor from conducting when the second input of the first driver circuit is at the low voltage with respect to the ground;
   wherein both first and second transistors are OFF when the first and second inputs of the first driver circuit are at the low voltage with respect to the ground so that the first high impedance path to the ground is provided at the first resistor terminal.

6. The programmable oscillator as set forth in claim 5, wherein the first, second, and third transistors are bipolar transistors.

7. The programmable oscillator as set forth in claim 2, wherein the switching circuit comprises:
   a difference amplifier with an output, a first input, and a second input coupled to the capacitor terminal; and
   a feedback circuit coupling the output of the difference amplifier to the first input of the difference amplifier to provide a hysteresis function to the switching circuit.

8. The programmable oscillator as set forth in claim 7, wherein the first driver circuit comprises:
   a first transistor to provide at the first resistor terminal the first low impedance path to the ground when the first transistor is conducting;
   a second transistor to provide at the first resistor terminal the first drive voltage when the second transistor is conducting; and
   a third transistor to prevent the second transistor from conducting when the second input of the first driver circuit is at the low voltage with respect to the ground;
   wherein both first and second transistors are OFF when the first and second inputs of the first driver circuit are at the low voltage with respect to the ground so that the first high impedance path to the ground is provided at the first resistor terminal, and wherein the first, second, and third transistors are bipolar transistors.

9. An apparatus for switching a bi-stable switching circuit at a first switching frequency and at a second switching frequency, the apparatus comprising:
   a capacitor;
   a first resistor coupled to the capacitor;
   a second resistor coupled to the capacitor;
   a bi-stable switching circuit with first and second stable states, having an input with an input voltage coupled to the capacitor and the first and second resistors, wherein when operating in a switching mode, the switching circuit changes from the first state to the second state when the input voltage is greater than a first threshold and changes from the second state to the first state when the input voltage is less than a second threshold;
   a first driver circuit, having a first input coupled to the switching circuit, a second input, and an output coupled to the first resistor, wherein the first driver circuit is put in an active state so as to charge and discharge the capacitor by providing at the second input of the first driver circuit a first high control impedance path to a ground, the first driver circuit to provide at its output, when in its active state, a first drive voltage when the switching circuit is in the first state and a first low impedance path to the ground when the switching circuit is in the second state; wherein the first driver circuit is put in an inactive state so as not to charge and discharge the capacitor by providing first and second low voltages at the first and second inputs of the first driver circuit, respectively, the first driver circuit to provide at its output, when in its inactive state, a first high impedance path to the ground; and
   a second driver circuit, having a first input coupled to the switching circuit, a second input, and an output coupled to the second resistor, wherein the second driver circuit is put in an active state so as to charge and discharge the capacitor by providing at the second input of the second driver circuit a second high control impedance path to the ground, the second driver circuit to provide at its output, when in its active state, a second drive voltage when the switching circuit is in the first state and a second low impedance path to the ground when the switching circuit is in the second state; wherein the second driver circuit is put in an inactive state so as not to charge and discharge the capacitor by providing third and fourth low voltages at the first and second inputs of the second driver circuit, respectively, the second driver circuit to provide at its output, when in its inactive state, a second high impedance path to the ground;
   wherein, the switching circuit switches between the first and second stable states at the first switching frequency when the first driver circuit is in its active state and the second driver circuit is in its inactive state, and the switching circuit switches between the first and second stable states at the second switching frequency when the first driver circuit is in its inactive state and the second driver circuit is in its active state.

10. The apparatus as set forth in claim 9, wherein the first driver circuit comprises:
   a first transistor connected between the ground and the output of the first driver circuit, having a base coupled to the first input of the first driver circuit, to provide at the output of the first driver circuit the first low impedance path to the ground when the first driver circuit is in its active state;
   a second transistor connected between a power supply terminal and the output of the first driver circuit, having a base coupled to the first input of the first driver circuit, to provide at the output of the first driver circuit the first drive voltage when the first driver circuit is in its active state; and
   a third transistor connected to the base of the second transistor, having a base coupled to the second input of the first driver circuit, to prevent the second transistor from conducting when the first driver circuit is in its inactive state, so that the first driver circuit provides at the output of the first driver circuit the first high impedance path to the ground;
   and the second driver circuit comprises:
   a fourth transistor connected between the ground and the output of the second driver circuit, having a base coupled to the first input of the second driver circuit, to provide at the output of the second driver circuit the second low impedance path to the ground when the second driver circuit is in its active state;
   a fifth transistor connected between a power supply terminal and the output of the second driver circuit, having a base coupled to the first input of the second driver circuit, to provide at the output of the second driver circuit the second drive voltage when the second driver circuit is in its active state; and a sixth transistor connected to the base of the fifth transistor, having a base coupled to the second input of the second driver circuit, to prevent the fifth transistor from conducting when the second driver circuit is in its inactive state, so that the second driver circuit provides at the output of the second driver circuit the second high impedance path to the ground; wherein the first, second, third, fourth, fifth, and sixth transistors are bipolar transistors.

11. The apparatus as set forth in claim 10, further comprising a control circuit coupled to the first and second driver circuits to put the first and second driver circuits in their active and inactive states.

12. The apparatus as set forth in claim 10, wherein the switching circuit comprises:

a difference amplifier, having first and second inputs and an output, for providing at the output of the difference amplifier a voltage responsive to the difference in voltages at the first and second inputs, the first input of the difference amplifier coupled to the input of the switching circuit; and a feedback circuit coupling the output of the difference amplifier to a second input of the difference amplifier for providing a hysteretic function to the switching circuit so that the first threshold is distinct from the second threshold.

13. The apparatus as set forth in claim 12, further comprising:

a current source circuit coupled to the power supply terminal;

a first common emitter stage, having an active load coupled to the current source circuit so that the active load of the first common emitter stage is biased by the current source circuit, having an input coupled to the output of the difference amplifier, and having an output coupled to the first input of the first driver circuit, to cause the first driver circuit to sequentially charge and discharge the capacitor when the first driver circuit is in its active state; and a second common emitter stage, having an active load coupled to the current source circuit so that the active load of the second common emitter stage is biased by the current source circuit, having an input coupled to the output of the difference amplifier, and having an output coupled to the first input of the second driver circuit, to cause the second driver circuit to sequentially charge and discharge the capacitor when the second driver circuit is in its active state.

14. The apparatus as set forth in claim 13, wherein the difference amplifier comprises a current mirror configured as an active load;

the feedback circuit comprises a third common emitter stage having a base coupled to the active load of the difference amplifier and a collector coupled to the second input of the difference amplifier to provide feedback between the output of the difference amplifier and the second input of the difference amplifier; and the apparatus further comprises an emitter follower stage having a base coupled to the collector of the third common emitter stage, the emitter of the emitter follower stage coupled to the input of the first common emitter stage and coupled to the input of the second common emitter stage so that the first and second common emitter stages are responsive to the voltage at the collector of the third common emitter stage.

15. An apparatus for switching a switching circuit at a first switching frequency and at a second switching frequency, the apparatus comprising:

a switching circuit, including:
  a difference amplifier having first and second inputs and an output; and
  a feedback circuit coupling the output of the difference amplifier to the second input of the difference amplifier so that the switching circuit has first and second stable states;

a first driver circuit having first and second inputs and an output, the first input of the first driver circuit coupled to the output of the difference amplifier, the first driver circuit including:
  a first transistor to provide at the output of the first driver circuit a first drive voltage when the switching circuit is in the first state;
  a second transistor to provide at the output of the first driver circuit a first low impedance path to a ground when the switching circuit is in the second state; and
  a third transistor coupled to the first and second transistors so that the first transistor is not conducting when the second transistor is providing the first low impedance path to the ground; wherein the first and second transistors are not conducting when the first and second inputs of the first driver circuit are held at a low voltage with respect to the ground; and a second driver circuit having first and second inputs and an output, the first input of the second driver circuit coupled to the output of the difference amplifier, the first driver circuit including:
  a third transistor to provide at the output of the second driver circuit a second drive voltage when the switching circuit is in the first state;
  a fourth transistor to provide at the output of the second driver circuit a second low impedance path to the ground when the switching circuit is in the second state; and
  a fifth transistor coupled to the third and fourth transistors so that the third transistor is not conducting when the fourth transistor is providing the second low impedance path to the ground; wherein the third and fourth transistors are not conducting when the first and second inputs of the second driver circuit are held at a low voltage with respect to the ground.

16. The apparatus as set forth in claim 15, wherein:

the switching circuit switches between the first and second stable states at the first switching frequency when a capacitor couples the first input of the difference amplifier to the ground, a first resistor couples the output of the first driver circuit to the first input of the difference amplifier, the first and second inputs of the second driver are held at the low voltage with respect to the ground so that the third and fourth transistors provide at the output of the second driver circuit the second high impedance path to the ground, and the first driver circuit is coupled to the difference amplifier so as to sequentially provide at the output of the first driver circuit the first drive voltage and the first low impedance path to the ground at the first switching frequency so as to sequentially charge and discharge the capacitor at the first switching frequency; and the switching circuit switches between the first and second stable states at the second switching frequency when the capacitor couples the first input of the difference amplifier to the ground, a second resistor couples the output of the second driver circuit to the first input of the difference amplifier, the first and second inputs of the first driver are held at the low voltage with respect to the ground so that the first and second transistors provide at the output of the first driver circuit the first high impedance path to the ground, and the second driver circuit is coupled to the difference amplifier so as to sequentially provide at the output of the second driver circuit the second drive voltage and the second low impedance path to the ground at the second switching frequency so as to sequentially charge and discharge the capacitor at the second switching frequency.

17. The apparatus as set forth in claim 16, further comprising a control circuit coupled to the first and second drivers so as to hold the first and second inputs of the first and second driver circuits at the low voltage with respect to the ground.

18. The apparatus as set forth in claim 15, further comprising:

a capacitor, having a potential voltage difference, coupling the first input of the difference amplifier to the ground wherein the first input of the difference amplifier has an input voltage that is a function of the potential voltage difference of the capacitor;

a first resistor coupling the output of the first driver to the capacitor so that the first driver circuit charges and discharges the capacitor via the first resistor; and a second resistor coupling the output of the second driver to the capacitor so that the second driver circuit charges and discharges the capacitor via the second resistor.

19. The apparatus as set forth in claim 15, wherein the first, second, third, fourth, and fifth transistors are bipolar transistors.

\* \* \* \* \*